US007706546B2

(12) United States Patent
Delchar et al.

(10) Patent No.: US 7,706,546 B2
(45) Date of Patent: Apr. 27, 2010

(54) COMPUTER-BASED ONBOARD NOISE SUPPRESSION DEVICES WITH REMOTE WEB-BASED MANAGEMENT FEATURES

(75) Inventors: David Gordon John Delchar, Leamington Spa (GB); Craig William Fellenstein, Brookfield, CT (US)

(73) Assignee: International Business Machines Corporation, Armonk, NY (US)

(*) Notice: Subject to any disclaimer, the term of this patent is extended or adjusted under 35 U.S.C. 154(b) by 1142 days.

(21) Appl. No.: 10/965,251

(22) Filed: Oct. 14, 2004

(65) Prior Publication Data

US 2005/0069144 A1 Mar. 31, 2005

Related U.S. Application Data

(62) Division of application No. 10/112,504, filed on Mar. 28, 2002, now abandoned.

(51) Int. Cl.

| | |
|---|---|
| ***H03B 29/00*** | (2006.01) |
| ***H04B 3/20*** | (2006.01) |
| ***H04B 15/00*** | (2006.01) |
| ***H04B 1/38*** | (2006.01) |

(52) U.S. Cl. .................... 381/71.1; 381/71.3; 381/71.4; 381/71.5; 381/71.6; 381/71.7; 381/94.1; 381/94.3; 381/66; 455/570; 370/286; 370/289

(58) Field of Classification Search ............... 381/71.1, 381/71.3–71.7, 94.1–94.7, 66, 93, 60; 700/94; 702/35, 36; 369/44.32, 44, 32; 361/387, 361/687; 379/406; 455/570; 370/282–289
See application file for complete search history.

(56) References Cited

U.S. PATENT DOCUMENTS

| | | | | |
|---|---|---|---|---|
| 5,243,648 | A | 9/1993 | Gilardi et al. | 380/6 |
| 5,434,925 | A * | 7/1995 | Nadim | 381/71.12 |
| 5,828,768 | A * | 10/1998 | Eatwell et al. | 381/333 |
| 5,995,632 | A * | 11/1999 | Okada | 381/71.3 |
| 6,061,456 | A | 5/2000 | Andrea et al. | 381/71.6 |
| 6,072,884 | A | 6/2000 | Kates | 381/318 |
| 6,081,593 | A | 6/2000 | Kim | 379/410 |
| 6,324,558 | B1 | 11/2001 | Wilber | 708/255 |
| 6,342,005 | B1 | 1/2002 | Daniels et al. | 454/338 |
| 6,343,127 | B1 | 1/2002 | Billoud | 381/71.4 |
| 6,381,222 | B1 * | 4/2002 | Kikinis | 370/280 |
| 6,591,198 | B1 * | 7/2003 | Pratt | 702/35 |
| 6,990,190 | B2 * | 1/2006 | Mauney et al. | 379/392.01 |
| 2003/0185403 | A1 | 10/2003 | Sibbald | 381/71.6 |

OTHER PUBLICATIONS

Merriam-Webster's Collegiate dictionary, 2000, Merriam-Webster, Tenth Edition, p. 841.

USPTO office action for 10/112504 dated Aug. 19, 2005.

USPTO office action for 10/112504 dated Jul. 30, 2004.

USPTO office action for 10/112504 dated Feb. 12, 2004.

* cited by examiner

*Primary Examiner*—Devona E Faulk
(74) *Attorney, Agent, or Firm*—Yee & Associates, P.C.; William H. Steinberg

(57) ABSTRACT

The present invention provides a method, apparatus, and computer implemented instructions for computer-based onboard noise suppression devices with remote web-based management features. The present invention detects noise within a computer. A noise canceling signal is generated based on parameters. These parameters may include, for example, the percentage of noise to suppress. The noise canceling signal is broadcasted to reduce or eliminate noise. Additionally, the present invention provides the ability to remotely manage noise suppression within computers.

3 Claims, 3 Drawing Sheets

COMPUTER-BASED ONBOARD NOISE SUPPRESSION DEVICES WITH REMOTE WEB-BASED MANAGEMENT FEATURES

This application is a divisional of application Ser. No. 10/112,504, filed Mar. 28, 2002, now abandoned, which is herein incorporated by reference.

BACKGROUND OF THE INVENTION

1. Technical Field

The present invention relates to an improved data processing system. In particular, the present invention relates to a method, apparatus, and computer instructions for computer-based onboard noise suppression devices with remote web-based management features.

2. Description of Related Art

In production environments, often times, noise levels are excessive where computing machinery may be operational. Excessive noise may be due to multiple pieces of computing machinery in a production area or the types of devices in the computing machinery. High frequency noise levels are generated by high speed disk storage devices and low frequency noise levels are generated by lower speed fan and cooling devices. Damaging high and low frequency noise levels are most often generated without concerns to people. At times, these noise levels can exceed what might be considered to be safe for operators of these various types of production equipment especially during extended periods of time. Likewise, these high decibel noise levels can be unsafe for visitors in surrounding noise affected areas. Exposure to dangerous noise levels could damage the hearing of an individual.

Therefore, it would be advantageous to have an improved method, apparatus, and computer instructions to allow users to set and monitor noise levels appropriate to their environment.

SUMMARY OF THE INVENTION

The present invention provides a method, apparatus, and computer implemented instructions for computer-based onboard noise suppression devices with remote web-based management features. The present invention detects noise within a computer. A noise canceling signal is generated based on parameters. These parameters may include, for example, the percentage of noise to suppress. The noise canceling signal is broadcasted to reduce or eliminate noise. Additionally, the present invention provides the ability to remotely manage noise suppression within computers.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
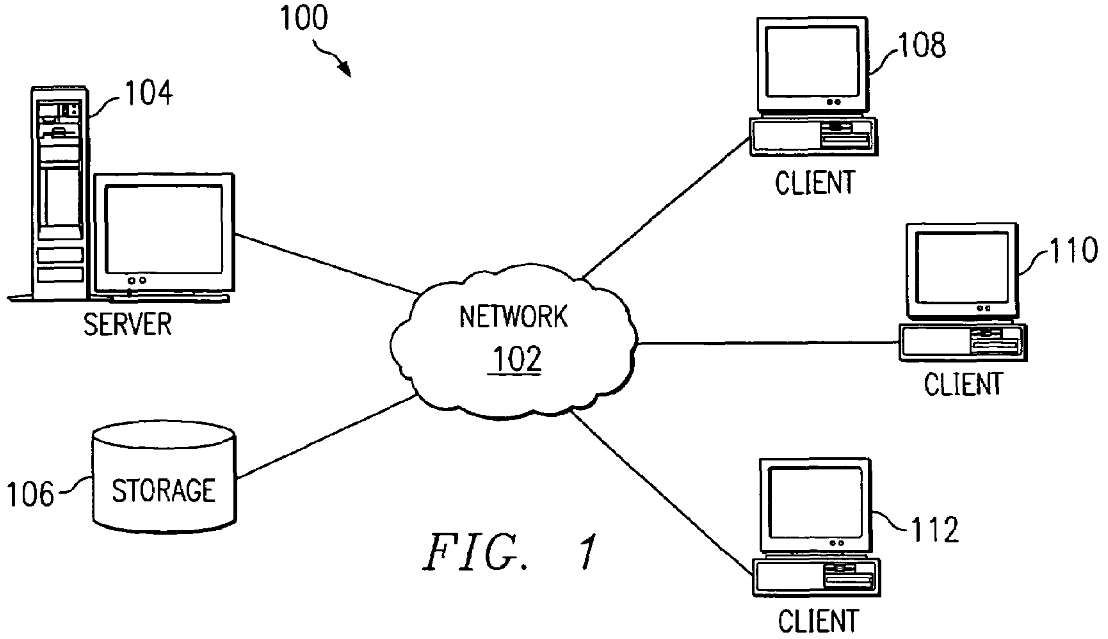
FIG. 1 depicts a pictorial representation of a network of data processing systems in which the present invention may be implemented.

With reference now to the figures, FIG. 1 depicts a pictorial representation of a network of data processing systems in which the present invention may be implemented. Network data processing system 100 is a network of computers in which the present invention may be implemented. Network data processing system 100 contains a network 102, which is the medium used to provide communications links between various devices and computers connected together within network data processing system 100. Network 102 may include connections, such as wire, wireless communication links, or fiber optic cables.

In the depicted example, server 104 is connected to network 102 along with storage unit 106. In addition, clients 108, 110, and 112 are connected to network 102. These clients 108, 110, and 112 may be, for example, personal computers or network computers. In the depicted example, server 104 provides data, such as boot files, operating system images, and applications to clients 108-112. Clients 108, 110, and 112 are clients to server 104. Network data processing system 100 may include additional servers, clients, and other devices not shown. In the depicted example, network data processing system 100 is the Internet with network 102 representing a worldwide collection of networks and gateways that use the TCP/IP suite of protocols to communicate with one another. At the heart of the Internet is a backbone of high-speed data communication lines between major nodes or host computers, consisting of thousands of commercial, government, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the present invention.

Figure 2:
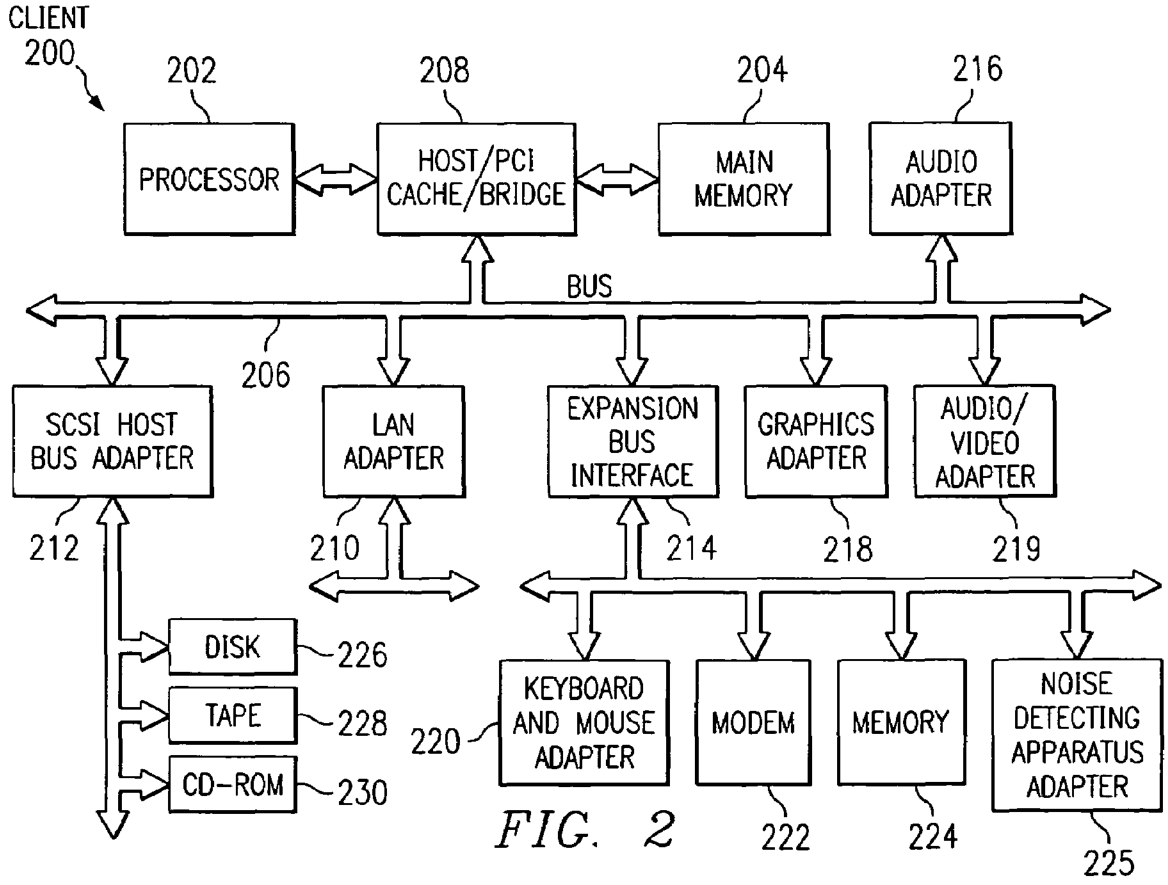
FIG. 2 is a block diagram illustrating a data processing system in which the present invention may be implemented.

With reference now to FIG. 2, a block diagram illustrating a data processing system is depicted in which the present invention may be implemented. Data processing system 200 is an example of an apparatus that may be used as a client computer or even as a server computer. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards.

In the depicted example, local area network (LAN) adapter 210, SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, additional memory 224, and noise detecting apparatus adapter 225. Noise detecting apparatus adapter 225 provides a connection for a microphone, a decibel sensor, or other hardware that can detect noise.

Small computer system interface (SCSI) host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system, such as Windows 2000, which is available from Microsoft Corporation. An object oriented programming system such as Java or Perl may run in conjunction with the operating system and provide calls to the operating system from Java programs or applications executing on data processing system 200. "Java" is a trademark of Sun Microsystems, Inc. "Perl" is programming language written by Larry Wall that combines syntax from several UNIX utilities and languages. Instructions for the operating system, the object-oriented operating system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

As another example, data processing system 200 may be a stand-alone system configured to be bootable without relying on some type of network communication interface, whether or not data processing system 200 comprises some type of network communication interface. As a further example, data processing system 200 may be a personal digital assistant (PDA) device, which is configured with ROM and/or flash ROM in order to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

Figure 3:
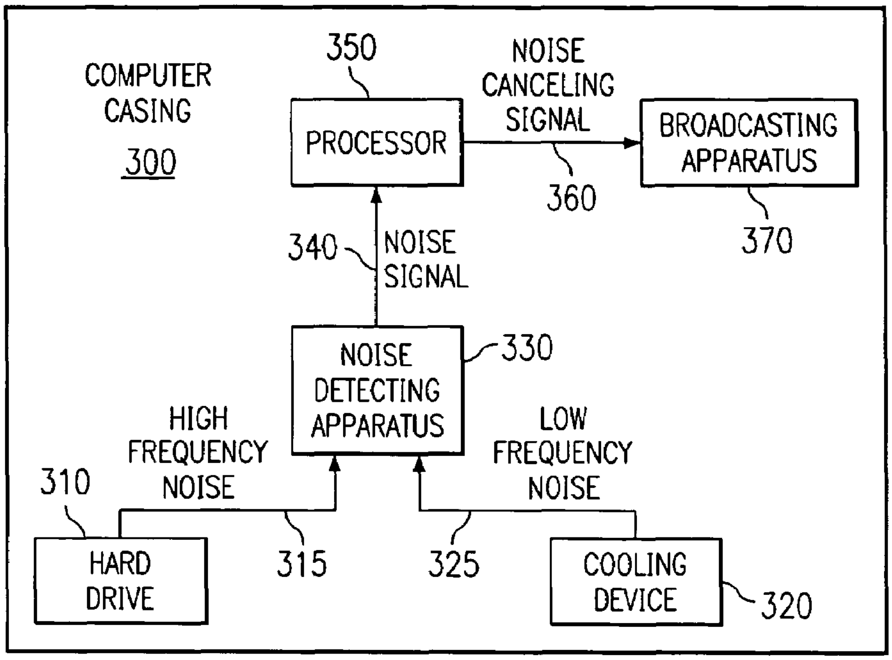
FIG. 3 is a block diagram of components located within a computer casing in accordance with a preferred embodiment of the present invention.

Next, FIG. 3 is a block diagram of components located within a computer casing in accordance with a preferred embodiment of the present invention. Computer casing 300 may be for a client or server computer such as client 200 in FIG. 2 or clients 108, 110, 112 or server 104 in FIG. 1. Noise generated within computer casing 300 may be undesirable. In this example, hard drive 310 produces high frequency noise 315 while cooling device 320 produces low frequency noise 325. Of course other devices may also generate noise that is undesirable such as disk drives, tape drives, power supplies, processor fans, power unit fans, or storage devices.

These high and low frequency noises may be unsafe or undesirable for the people residing in the noise affected area. In the present invention, the user may choose to eliminate or suppress the noise level within a computer. The operating system of the computer or some other software component may be used to control the amount of noise canceled within the computer. This reduction of noise may be selected using different measures, such as, for example a percentage reduction in noise. Noise detecting apparatus 330 monitors the noise level within computer casing 300 by detecting noise such as high frequency noise 315 and low frequency noise 325. Noise detecting apparatus 330 sends noise signal 340 to processor 350. Processor 350 controls the phase and amplitude modulation control of noise canceling signal 360.

Noise canceling signal 360, also referred to as white noise, is an opposite signal to the noise level within the computer. "White noise" is a random interference generated by the movement of electricity and can be used to cancel noise. Although, white noise is well known in many noise intensive environments, self-correcting noise suppressing functions within a computer are a unique improvement in noise reduction techniques.

Noise canceling signal 360 is transmitted by broadcasting apparatus 370 to eliminate or reduce the noise level within computer casing 300. A loudspeaker and a transducer are examples of broadcasting apparatus that may be used.

Figure 4:
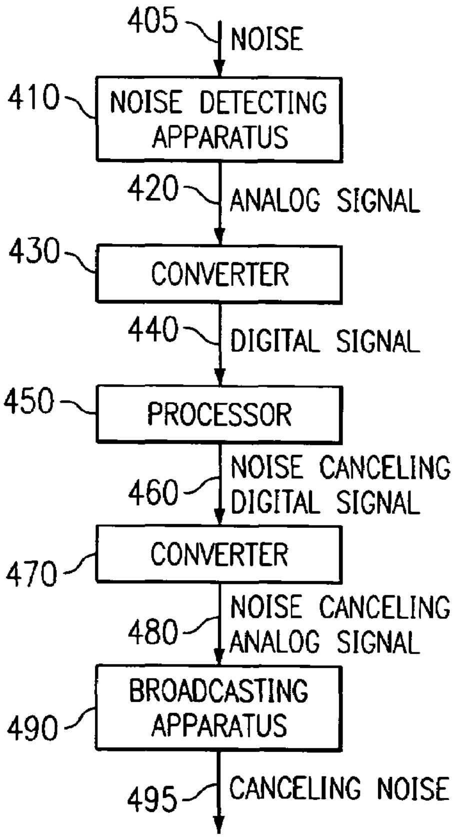
FIG. 4 is a block diagram of components used to modify the noise level in accordance with a preferred embodiment of the present invention.

FIG. 4 is a block diagram of components used to modify the noise level in accordance with a preferred embodiment of the present invention. Noise 405 is detected by noise detecting apparatus 410. Noise detecting apparatus 410 may include for example a microphone mounted within the casing of the computer. Multiple microphones may be used depending on the particular implementation. With the multiple microphone implementation, the microphones may be mounted or located near noise sources within the computer casing, such as a hard disk drive, power supply, or fan. Microphones may also be located in specific areas within the computer, such as the center of the top and sides of the computer casing.

Noise detecting apparatus 410 sends analog signal 420 to converter 430. Converter 430 converts analog signal 420 to digital signal 440. In an alternative method, noise detecting apparatus 410 may include an analog to digital (ADC) signal converter rather than using a separate converter, such as converter 430.

Digital signal 440 is stored by processor 450. Processor 450 generates noise canceling digital signal 460. Processor 450 sends noise canceling digital signal 460 to converter 470. Converter 470 converts noise canceling digital signal 460 to noise canceling analog signal 480. Converter 470 sends noise canceling analog signal 480 to broadcasting apparatus 490. Broadcasting apparatus 490 may be for example a loudspeaker or transducer mounted within the casing of the computer. Multiple loudspeakers or transducers may be mounted within the computer and may be located in various locations, such as in the vicinity of the noise detecting apparatus. Broadcasting apparatus 490 transmits canceling noise 495 to reduce or eliminate noise.

In a preferred embodiment of the present invention the noise detecting apparatus and the broadcasting apparatus are located within the computer to avoid detecting extraneous noise. However, either or both the noise detecting apparatus and the broadcasting apparatus may be located outside the computer in an alternative configuration.

Figure 5:
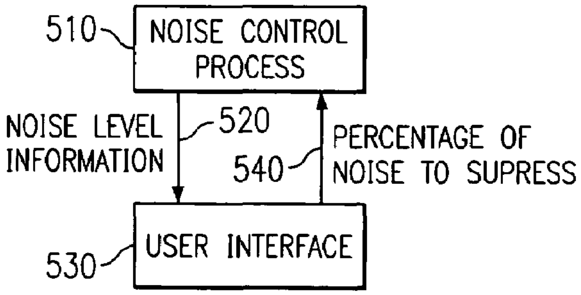
FIG. 5 is a block diagram of the noise control process in accordance with a preferred embodiment of the present invention.

FIG. 5 is a block diagram of the noise control process in accordance with a preferred embodiment of the present invention.

Noise control process 510 includes programs, such as for example Perl scripts, C procedures, or UNIX scripts, within the computer, which is being monitored for the noise level. Noise control process 510 sends noise level information 520 to user interface 530. Noise level information may be displayed to the user by user interface 530. The user can use noise level information 520 to determine the percentage to suppress noise.

Alternatively, the percentage may be selected automatically based on preselected parameters that identify acceptable or safe levels of noise. The user may choose to suppress all noise, a portion of noise, or not to modify the noise. The user may enter a percentage and user interface 530 sends percentage of noise to suppress 540 to noise control process 510. Noise control process 510 uses percentage of noise to suppress 540 as a parameter to generate the noise canceling signal such as noise canceling digital signal 460 in FIG. 4. Another example of a parameter that may be used is a value for the desired noise level, such as zero when all noise to be eliminated.

Additional parameters may include actual decibels, decibels to maintain, noise frequency, values for unsafe noise levels, and work values for noise predicted from a noise source. The processor could use the work values to predict the noise level and generate a noise canceling signal to prevent the unwanted noise. The present invention includes a continuous cycle of noise checking. In a preferred embodiment of the present invention, the Least Mean Square (LMS) algorithm is used for noise reduction. LMS is a steepest descent search algorithm, which is well known in prior art.

Noise control process 510 may be executed remotely from a computer such as server 104 in FIG. 1.

Figure 6:
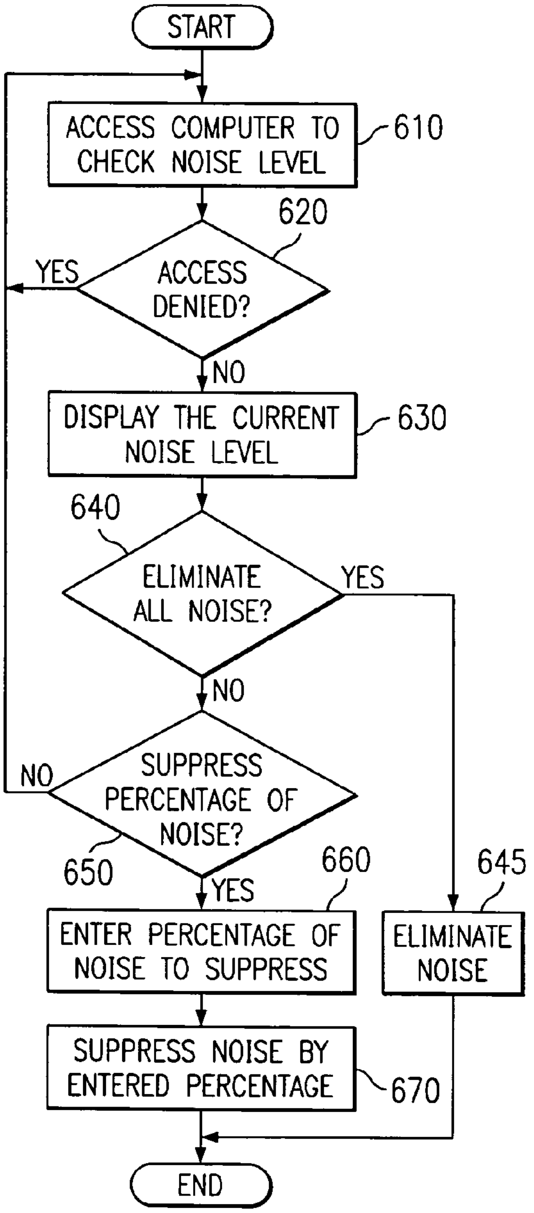
FIG. 6 is a flowchart of the process for remote noise level management in accordance with a preferred embodiment of the present invention.

Next, FIG. 6 is a flowchart of the process for remote noise level management in accordance with a preferred embodiment of the present invention, which is used by noise control process 510 in FIG. 5. A user tries to access a computer to determine the noise level (step 610). A determination is made as to whether access is denied (step 620). If access is denied, the process returns to the beginning at step 610. If access is granted, the current noise level is displayed to the user (step 630). A determination is made whether to eliminate all noise (step 640).

If all noise is to be eliminated, eliminate all noise using a noise canceling signal (step 645) with the process terminating thereafter. Step 645 is explained in detail with FIG. 9. Otherwise, a determination is made whether to suppress a percentage of noise (step 650). If noise is not to be suppressed, the process returns to the beginning at step 610. If noise suppression is desired, the user enters a percentage of noise to suppress (step 660). The noise is suppressed by the entered percentage (step 670) with the process terminating thereafter. Step 670 is discussed in more detail in FIG. 7.

Figure 7:
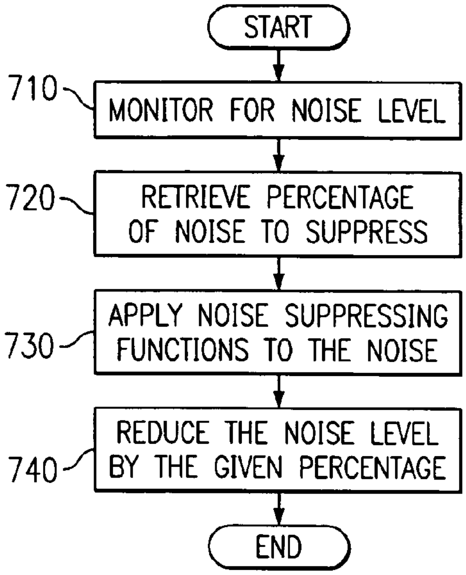
FIG. 7 is a flowchart of the process to suppress noise by a selected percentage in accordance with a preferred embodiment of the present invention.

FIG. 7 is a flowchart of the process to suppress noise by a selected percentage in accordance with a preferred embodiment of the present invention. The noise within a computer is monitored to determine the noise level (step 710). A parameter with the value of percentage of noise to suppress is retrieved (step 720). Noise suppressing functions, such as the Least Mean Square algorithm, are applied to the noise (step 730). The noise level is reduced by the given percentage in the parameter retrieved in step 720 (step 740) with the process terminating thereafter.

Figure 8:
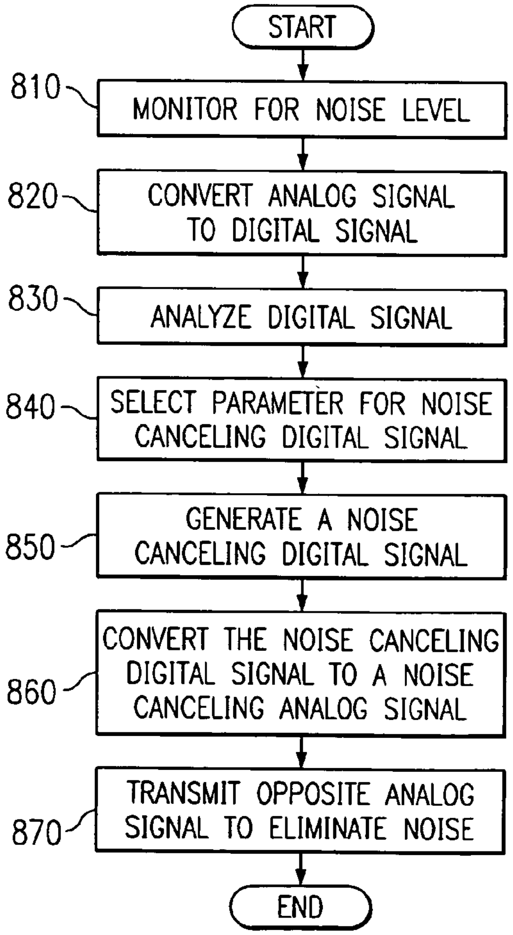
FIG. 8 is a flowchart of the process to eliminate noise in accordance with a preferred embodiment of the present invention.

FIG. 8 is a flowchart of the process to eliminate noise in accordance with a preferred embodiment of the present invention. The noise within a computer is monitored to determine the noise level (step 810). The analog signal of the noise is converted to a digital signal (step 820). The digital signal is analyzed (step 830). The parameter for the noise canceling digital signal is retrieved (step 840). A noise canceling digital signal is generated (step 850). The noise canceling digital signal is converted to a noise canceling analog signal (step 860). Then, the noise canceling analog signal is transmitted to eliminate noise (step 870) with the process terminating thereafter.

Thus, the present invention provides an improved method, apparatus, and computer instructions for computer-based onboard noise suppression devices with remote web-based management features. The present invention provides a method to eliminate or reduce unsafe and undesirable noise levels within a computer. Implementing the present invention with in a computer casing allows noise from within the computer to be reduced or eliminated without the added complexity of other outside noises. For example, a person passing by the computer could be creating loud noise, which would not effect the noise reduction of the present invention. Additionally, the present invention provides the advantage of remotely managing noise suppression within computers, which allows operators to reduce noise prior to entering noise affected areas. The present invention may be used to retrofit existing computers or implemented in newly built computer systems.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as floppy disk, a hard disk drive, a RAM, CD-ROMs, and DVD-ROMS, the computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method in a data processing system comprising a plurality of computers for reducing noise generated within a first computer, the computer implemented method comprising:

remotely accessing the first computer in the plurality of computers, using a second computer in the plurality of computers, to determine a noise level of a noise signal in the first computer, wherein the noise level of the noise signal within the first computer is determined using a noise detecting apparatus located within the first computer;

determining whether the remote access to the first computer is granted;

responsive to determining that the remote access is granted, displaying the noise level of the noise signal to a user;

determining an amount of the noise level of the noise signal to suppress within the first computer based on user defined parameters;

responsive to determining the noise level to suppress, generating a noise canceling signal using the user defined parameters; and broadcasting the generated noise canceling signal, wherein the noise signal is reduced to an acceptable noise level as indicated by the user defined parameters.

2. A network data processing system comprising:

a bus system;

a communications unit connected to the bus system;

a memory connected to the bus system, wherein the memory includes as set of instructions; and a processing unit connected to the bus system, wherein the processing unit executes the set of instructions to remotely access a first computer in a plurality of computers, using a second computer in the plurality of computers, to determine a noise level of a noise signal in the first computer, wherein the noise level of the noise signal within the first computer is determined using a noise detecting apparatus located within the first computer; determine whether the remote access to the first computer is granted; display the noise level of the noise signal to a user, responsive to determining that the remote access is granted; determine an amount of the noise level of the noise signal to suppress within the first computer based on user defined parameters; responsive to determining the noise level to suppress, generate a noise canceling signal using the user defined parameters; and broadcast the generated noise canceling signal, wherein the noise signal is reduced to an acceptable noise level as indicated by the user defined parameters.

3. A computer recordable-type storage medium storing executable instructions for reducing noise generated by a first computer in a network data processing system, the executable instructions comprising:

instructions for remotely accessing the first computer in a plurality of computers, using a second computer in the plurality of computers, to determine a noise level of a noise signal in the first computer, wherein the noise level of the noise signal within the first computer is determined using a noise detecting apparatus located within the first computer;

instructions for determining whether the remote access to the first computer is granted;

instructions for displaying the noise level of the noise signal to a user responsive to determining that the remote access is granted;

instructions for determining an amount of the noise level of the noise signal to suppress within the first computer based on user defined parameters;

instructions for responsive to determining the noise level to suppress, generating a noise canceling signal using the user defined parameters; and instructions for broadcasting the generated noise canceling signal, wherein the noise signal is reduced to an acceptable noise level as indicated by the user defined parameters.

* * * * *